US006534423B1

(12) United States Patent
Turner

(10) Patent No.: US 6,534,423 B1
(45) Date of Patent: Mar. 18, 2003

(54) USE OF INDUCTIVELY-COUPLED PLASMA IN PLASMA-ENHANCED CHEMICAL VAPOR DEPOSITION REACTOR TO IMPROVE FILM-TO-WALL ADHESION FOLLOWING IN-SITU PLASMA CLEAN

(75) Inventor: Michael Turner, Austin, TX (US)

(73) Assignee: Novellus Systems, Inc., San Jose, CA (US)

(*) Notice: Subject to any disclaimer, the term of this patent is extended or adjusted under 35 U.S.C. 154(b) by 32 days.

(21) Appl. No.: 09/752,698

(22) Filed: Dec. 27, 2000

(51) Int. Cl.⁷ .................. H01L 21/31; H01L 21/469
(52) U.S. Cl. .......................... 438/784; 438/788
(58) Field of Search ................. 438/763, 158, 438/148, 784, 788

(56) References Cited

U.S. PATENT DOCUMENTS

| | | | | |
|---|---|---|---|---|
| 5,231,334 A | * | 7/1993 | Paranjpe | 315/111.21 |
| 5,346,578 A | * | 9/1994 | Benzing et al. | 156/345 |
| 5,405,480 A | * | 4/1995 | Benzing et al. | 156/345 |
| 5,523,261 A | * | 6/1996 | Sandhu | 438/228 |
| 5,605,599 A | * | 2/1997 | Benzing et al. | 156/643.1 |
| 5,614,055 A | * | 3/1997 | Fairbairn et al. | 156/345 |
| 5,628,829 A | * | 5/1997 | Foster et al. | 118/723 |
| 5,643,640 A | * | 7/1997 | Chakravarti et al. | 427/578 |
| 5,656,123 A | * | 8/1997 | Salimian et al. | 156/345 |
| 5,683,548 A | * | 11/1997 | Hartig et al. | 156/643.1 |
| 5,756,400 A | * | 5/1998 | Ye et al. | 438/710 |
| 5,846,883 A | * | 12/1998 | Moslehi | 438/711 |
| 5,962,345 A | * | 10/1999 | Yen et al. | 438/709 |
| 6,013,584 A | * | 1/2000 | M'Saad | 438/784 |
| 6,093,660 A | * | 7/2000 | Jang et al. | 438/763 |
| 6,107,192 A | * | 8/2000 | Subrahmanyan et al. | 438/637 |
| 6,184,158 B1 | * | 2/2001 | Shufflebotham et al. | 438/788 |
| 6,380,612 B1 | * | 4/2002 | Jang et al. | 257/649 |
| 2001/0008138 A1 | * | 7/2001 | Demos et al. | 134/1.1 |

* cited by examiner

Primary Examiner—David Nelms
Assistant Examiner—Andy Huynh
(74) Attorney, Agent, or Firm—Skjerven Morrill LLP

(57) ABSTRACT

An inductively-coupled hydrogen plasma (ICP) is used to passivate a plasma-enhanced chemical vapor deposition reactor following an in situ cleaning step. The hydrogen ICP effectively removes the fluorine and hydrogen that typically become impregnated in the walls of the reaction chamber during the in situ clean and thereby reduces the amount of "outgassing" that occurs during subsequent deposition cycles. This outgassing may cause the film of deposition material that normally forms on the walls to flake, significantly reducing the yield of usable devices. The hydrogen ICP passivation process has been found particularly effective in conjunction with the deposition of heavily-doped silicon oxide layers.

14 Claims, 3 Drawing Sheets

USE OF INDUCTIVELY-COUPLED PLASMA IN PLASMA-ENHANCED CHEMICAL VAPOR DEPOSITION REACTOR TO IMPROVE FILM-TO-WALL ADHESION FOLLOWING IN-SITU PLASMA CLEAN

FIELD OF THE INVENTION

This invention relates to plasma-enhanced chemical vapor deposition reactors and in particular to a method of improving the performance of such reactors following an in-situ clean of the reaction chamber.

BACKGROUND OF THE INVENTION

Plasma-enhanced chemical vapor deposition reactors are widely used in the semiconductor industry to deposit thin films onto semiconductor wafers. As a byproduct of the deposition process, a thin film is also deposited on the walls of the reactor chamber, and this film must be periodically removed. Otherwise, the material on the walls of the reaction chamber will begin to flake off during the deposition process and land on the wafer, seriously reducing the yield of acceptable chips from the wafer.

One method of cleaning the walls of the reactor chamber is an in situ process. This type of process uses a plasma generated in the chamber to remove the thin film from the walls. In situ processes are generally quicker to perform and result in less down-time than cleaning processes that require the reactor to be disassembled.

One in situ cleaning process, for example, uses a plasma of $NF_3$ and $O_2$. HF is a byproduct of the cleaning plasma. Following the cleaning process, it has been found necessary to "passivate" the reaction chamber to eliminate some of the effects of the plasma before resuming the normal processing of wafers. In particular, during the cleaning the walls of the chamber tend to become impregnated with F or HF, and these materials "outgas" (i.e., are expelled from the walls) during the subsequent deposition process. The outgassing molecules enter the thin film that, as described above, forms on the walls during processing and loosen the film, creating flaking. The outgassing molecules may also impregnate the thin film that is being deposited on the wafer, creating adhesion problems.

When films of a relatively low percentage (e.g., $\leq 5\%$) of a dopant (e.g., phosphorus) are being deposited, flaking has been prevented by using a capacitively-coupled hydrogen plasma (CCP) to passivate the chamber after cleaning. With films of a high percentage of dopant, however, this passivation process has been found inadequate, even when extended for periods substantially longer than the normal passivation.

Hence there is a need for a passivation process that can prevent flaking from the walls of the chamber because of outgassing after a deposition of a highly-doped film.

SUMMARY OF THE INVENTION

In accordance with this invention, an inductively-coupled hydrogen plasma (ICP) is used to passivate the reaction chamber after in situ clean. Use of an ICP has been found to materially reduce the flaking of material from the walls of the chamber during a deposition of a highly-doped thin film.

DESCRIPTION OF THE INVENTION

Figure 1:
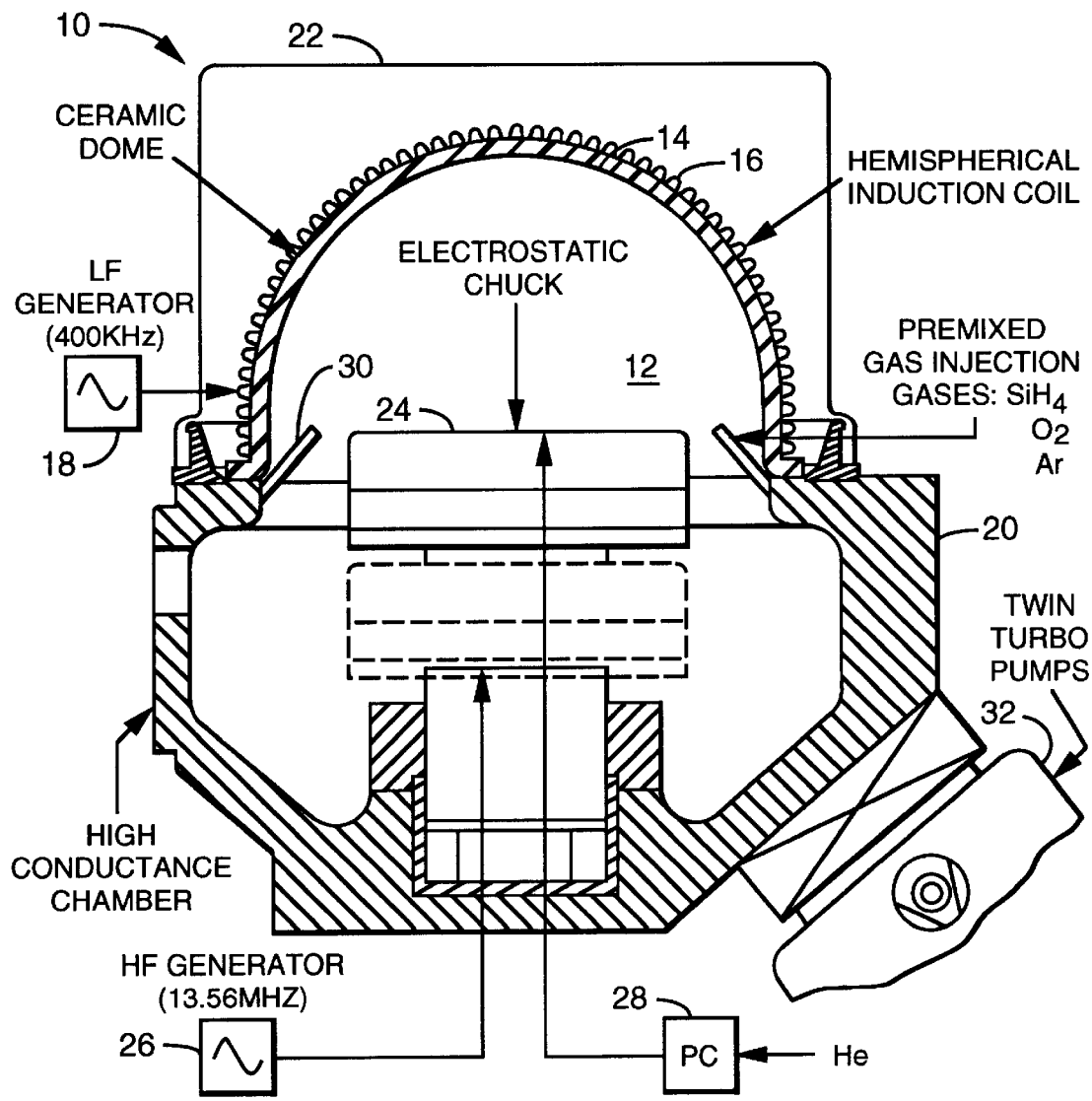
FIG. 1 is a cross-sectional view of a plasma-enhanced chemical vapor deposition chamber.

The method of this invention uses an inductively-coupled hydrogen plasma. To generate this type of plasma, a plasma-enhanced chemical vapor deposition (PECVD) reactor is required. One example of a PECVD is the Concept Two Speed® reactor manufactured by Novellus Systems, Inc., of San Jose, Calif., shown generally in FIG. 1. PECVD reactor 10 includes a reaction chamber 12 which is surrounded by a hemispherical ceramic dome 14. Wound around the outside of dome 14 is a hemispherical copper induction coil 16, which is supplied by a low-frequency generator 18, which in this embodiment supplies a 300–450 kHz signal at up to 5 kW. Dome 14 is attached to a high conductance chamber 20 and is enclosed by a stainless steel source housing 22. A semiconductor wafer or other substrate is clamped to an electrostatic chuck 24. The clamping force is provided by a 0–1200 V 13.56 MHZ signal supplied by a high-frequency generator 26. The high-frequency (HF) signal automatically compensates for the DC self-bias on the wafer by shifting the voltage applied to each pole of the electrostatic chuck 24. Heat transfer through the wafer is controlled by using a pressure controller 28 to control the pressure of a gas sealed in electrostatic chuck 24. As shown, electrostatic chuck 24 is movable vertically from a higher, operational position to a lower, loading position (dashed lines). Reactive gases are injected into chamber 12 by a series of jets arrayed radially around the chuck 24. Twin turbo exhaust pumps 32 have a capacity of approximately 1100 lps each and permit low pressure (<5 mTorr) operation at high gas loads (approximately 500 sccm). The Speed® reactor contains settings which permit the operator to create a capacitively-coupled or an inductively-coupled plasma. During normal operation, an inductively-coupled plasma is used.

A capacitively-coupled hydrogen plasma (CCP) is obtained by flowing in a small volume of $H_2$ at low pressure (0–10 mTorr) and creating a CCP plasma. As noted above, a CCP plasma is sufficient to passivate the chamber 12 when films containing a low percentage of dopant are being deposited. CCP has been found inadequate, however, to prevent flaking when films containing a high percentage of dopant are being formed.

A series of tests were performed to determine the efficacy of hydrogen CCP and/or ICP passivation cycles. The tests are described and the results are indicated below.

Test 1

Following an idle period, three batches of 4 wafers each were processed on a Novellus Concept Two Speed reactor. On each wafer a silicon oxide film doped with 9% phosphorus was deposited to a thickness of 9,000 Å. Following each batch, the reactor was cleaned in situ, and a hydrogen CCP passivation was performed for 10 minutes (600 seconds), which is 2½ times the length of a normal 240-second passivation. $H_2$ was flowed at 1000 sccm and $O_2$ was flowed at 550 sccm. The HF power was set at 3 kW. Flaking occurred on final two wafers in the third batch (i.e., the 11th and 12th wafers).

The reason that flaking occurs after 10 wafers have been processed is that the walls of the reactor start out hot after an idle period (during which a plasma is continuously generated). The hot walls prevent the absorption of gases. As the wafers are processed, however, the walls cool down during the cleaning cycles, and eventually they become cool enough that F and HF begin to be absorbed.

The conclusion from Test 1 was that the hydrogen CCP passivation process failed to prevent flaking even when performed for substantially longer than a normal passivation cycle.

Test 2

A second test was performed to determine the utility of an inductively-coupled hydrogen plasma for passivation. Following Test 1 (without an idle period), the reactor was again cleaned in situ, and a hydrogen CCP passivation was performed for 600 seconds. This time, however, the CCP passivation was followed by an inductively-coupled hydrogen plasma (ICP) for an additional 10 minutes, during which the HF power was set at 4000 W; $H_2$ was flowed at 400 sccm and He was flowed at 50 sccm. Following the combined CCP/ICP passivation, the same deposition process described above under Test 1 was performed on another batch of 4 wafers. No flaking was observed. Normally, once flaking begins to occur, it continues to occur until the reactor is allowed to remain idle for some time (e.g., a half-hour). The conclusion was that the addition of the ICP passivation seemed to prevent flaking.

Test 3

A test was then performed to determine the effect of reducing the duration of the CCP and ICP passivations from 600 seconds each. Following Test 2, the reactor was again cleaned in situ. Next, a hydrogen CCP passivation was performed for 30 seconds, and this was followed by a hydrogen ICP passivation for an additional 210 seconds. The HF power was set at 4000 W; $H_2$ was flowed at 400 sccm and He was flowed at 50 sccm. Following the CCP/ICP passivations, a silicon oxide film doped with 9% phosphorus was deposited to a thickness of 9,000 Å. This process was performed on a batch of 4 wafers. No flaking was observed. The conclusion was that the hydrogen ICP passivation seemed to prevent flaking even when performed for a shorter time period (from 600 seconds down to 210 seconds).

Test 4

The phosphorus-doped silicon oxide deposition process described above was performed on 30 wafers. After each four-wafer batch, the reactor was cleaned in situ, and the 30-second CCP and 210-second ICP passivations described above were repeated. Even after 30 wafers, no flaking was observed. This was viewed as strong evidence that the hydrogen ICP passivation successfully eliminated flaking.

Test 5

It had been found that flakes occurred in depositing a heavily phosphorous doped silicon oxide when the thickness of the film on the chamber walls exceeded 13 $\mu$m. The thickness of the film would not normally exceed 15 $\mu$m prior to cleaning the chamber walls with an in situ plasma clean. To test the effectiveness of the hydrogen ICP process, deposition cycles were run in which the thickness of the film on the chamber walls was allowed to reach 36 $\mu$m. The goal was to measure the benefit of the hydrogen ICP process objectively by determining the thickness at which the film started to flake. Three batches of 15 wafers leading to a 36 $\mu$m film accumulation were run with no evidence of flaking. The test failed to find the point at which flaking started, but a measured improvement was observed when the film thickness was in the range of 13 $\mu$m to 36 $\mu$m.

Test 6

Figure 2:
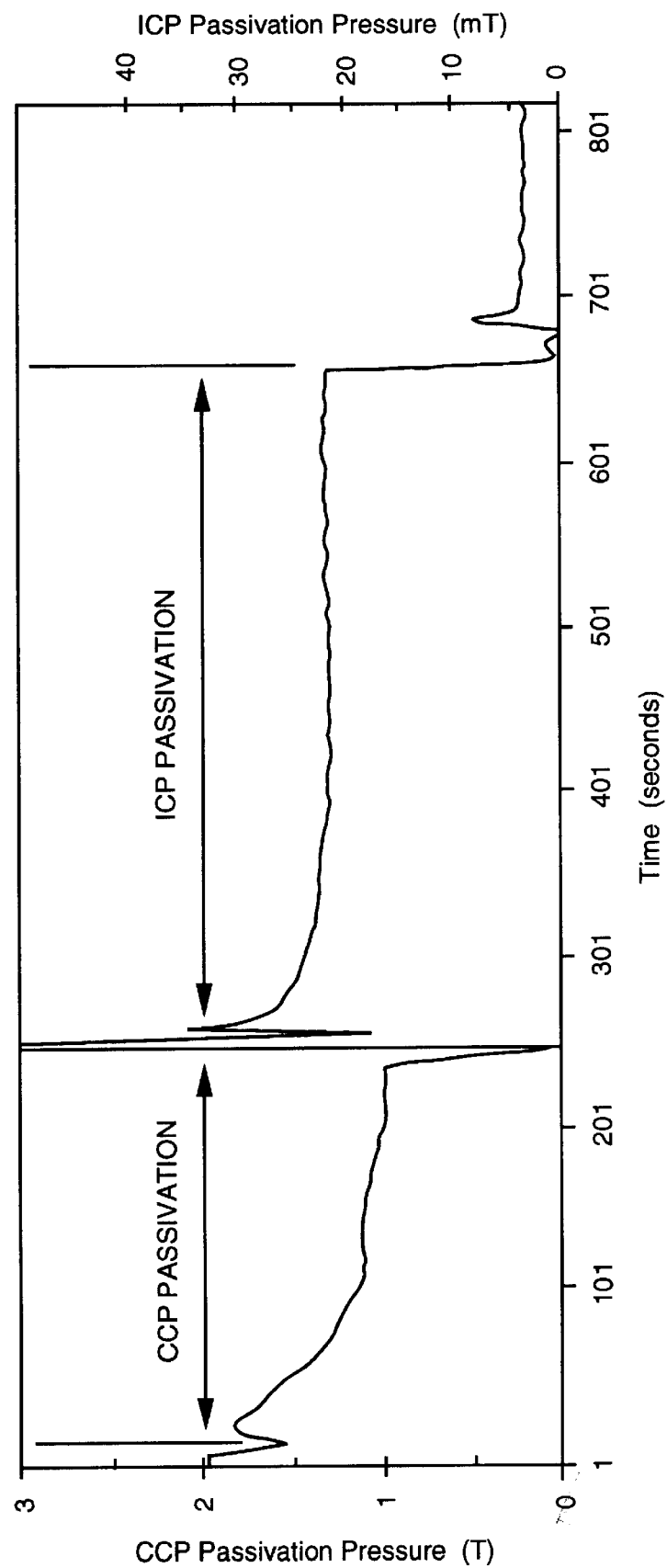
FIG. 2 is a graph showing how the pressure in a reaction chamber continues to fall when an inductively-coupled plasma (ICP) is generated after a capacitively-coupled plasma (CCP), indicating that the latter failed to remove all of the gas from the walls of the chamber.

If a passivation cycle is effective, no gas should remain in the walls of the reaction chamber. To test the effectiveness of a normal hydrogen CCP, the pressure in the chamber was monitored during a hydrogen ICP that was performed after the hydrogen CCP. If the hydrogen CCP was effective, no pressure change should be observed. The results are shown in FIG. 2. In both tests, the gas flows and power remained constant. As indicated, the hydrogen CCP passivation lasted 240 seconds, and the pressure fell from slightly less than 2 Torr to about 1 Torr (lefthand scale). The hydrogen ICP process was carried out for about 400 seconds and the pressure fell from about 35 mTorr to about 20 mTorr (righthand scale). The fact that outgassing continued to occur during the hydrogen ICP indicates that the hydrogen CCP passivation was incomplete.

Test 7

Additional outgassing data were collected using optical emission spectra (OES). A 9000 Å thick, 9% phosphorus-doped silicon oxide layer was deposited on a batch of 4 wafers. The Speed® reactor was then cleaned and passivated using a normal 240-second CCP passivation. The same deposition and clean were performed, this time followed by the ICP passivation described above under Test 3. Following each type of passivation, the OES of hydrogen were measured as the reactor was idle at a low-frequency power of 4000 W and gas flows of 120 sccm $O_2$ and 200 sccm He. The OES were measured using a Spectra View analyzer from Verite Instruments of Carrolton, Tex. A higher level of hydrogen OES indicated a higher concentration of hydrogen (and fluorine) in the chamber.

Figure 3:
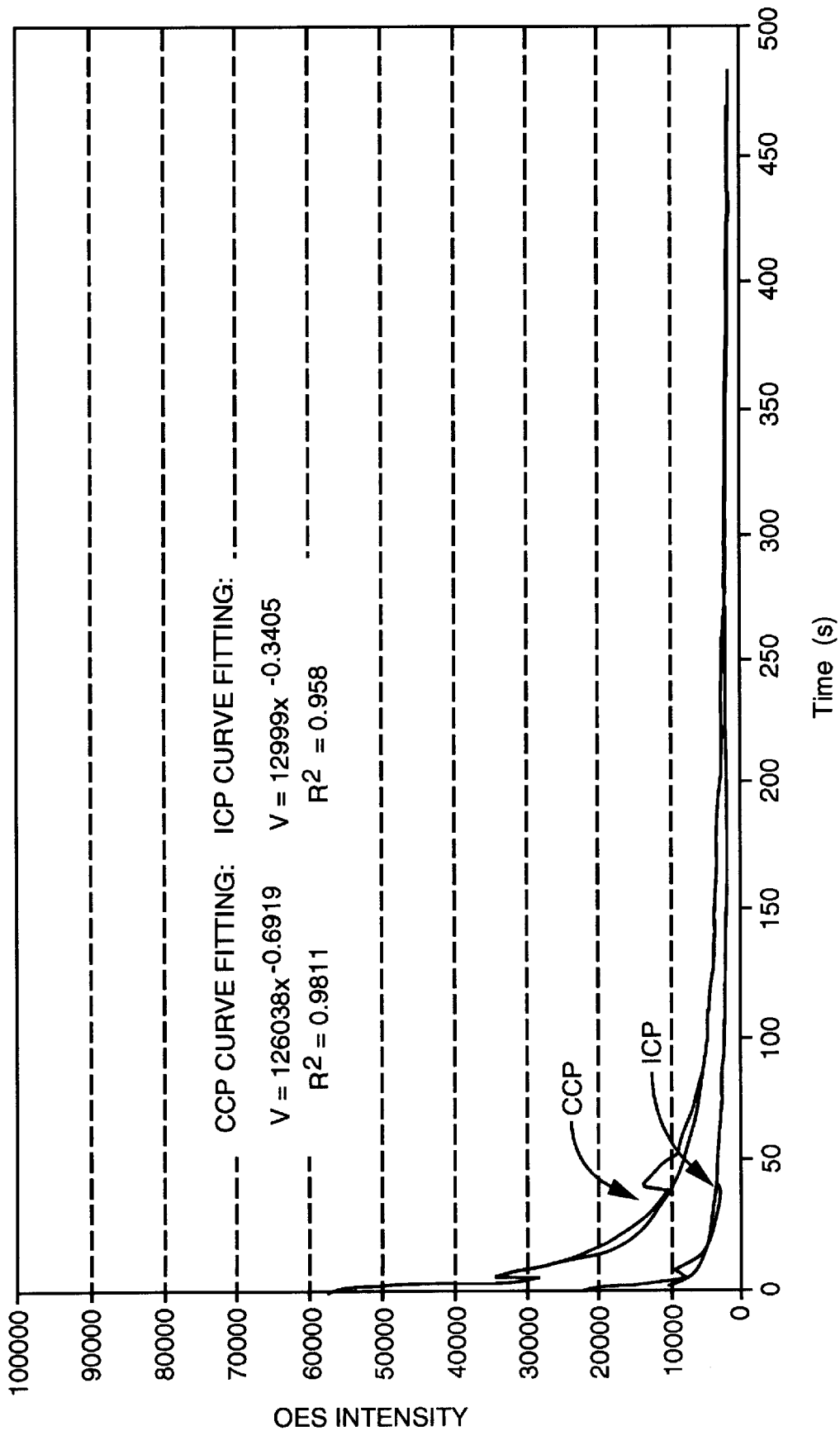
FIG. 3 is a graph of the optical emission spectra intensity of hydrogen and fluorine during an idle period following a conventional CCP passivation and an ICP passivation, respectively, indicating that a greater amount of hydrogen and fluorine remains in the reaction chamber following the CCP passivation.

The results are shown in FIG. 3. The curves labeled "CCP" and "ICP" show the OES of hydrogen during the idle period following the CCP and ICP passivations, respectively. Since the pressure, power and input gas flows were the same for the idle periods following each type of passivation, the absolute OES intensity provides a comparison of the concentration of hydrogen and fluorine remaining after the passivations. The area under the CCP curve is 6.5 times greater than the area under the ICP curve over the 500-second time period shown in FIG. 3. The time to reach 10% above the settling point was 2.67 minutes for the ICP passivation as compared with 6 minutes for the CCP passivation.

The above tests show definitely the value of an inductively-coupled hydrogen plasma in removing gases such as fluorine and hydrogen that become entrapped in the walls of a plasma-enhanced CVD reaction chamber during an in situ cleaning process. In production runs, the use of a CCP for passivation has been abandoned entirely, and passivation is accomplished using a 300-second hydrogen ICP. In a marathon test, 5,000 wafers were processed between idle periods without flaking. As a result of the improved passivation of the chamber, the permitted thickness of the film on the walls of the chamber in production has been increased from 13 $\mu$m to 18 $\mu$m. This in turn allows wafers to a processed in batches of six rather than four and increases the total throughput of the PECVD reactor per unit of time.

While the deposition process described above involves a 9% phosphorus-doped silicon oxide ($SiO_2$) layer, the scope of this invention is not so limited. For example, the principles of this invention are also applicable to $SiO_2$ doped with other materials, such as fluorine, boron or a combination of phosphorus and boron, and doped at percentages higher or lower than 9%. The invention is also useful with undoped $SiO_2$ and with SiC and SiN films.

I claim:

1. A method of passivating a plasma-enhanced chemical vapor deposition reactor, following an in situ cleaning process and preceding a deposition process, the method comprising creating an inductively-coupled plasma inside the reactor.

2. The method of claim 1 wherein said creating comprises introducing hydrogen into the reactor.

3. The method of claim 2 wherein said creating comprises applying a fluctuating voltage to a coil.

4. The method of claim 3 wherein said creating comprises applying a power of about 4000 W to the coil.

5. The method of claim 1 comprising forming a capacitively-coupled plasma inside the reactor.

6. The method of claim 5 wherein said forming precedes said creating.

7. A process performed in a plasma-enhanced chemical vapor deposition reactor comprising:

cleaning the reactor in situ;

after said cleaning, creating an inductively-coupled plasma inside the reactor; and after said creating, depositing a doped layer of material on a substrate.

8. The process of claim 7 wherein said depositing comprises depositing silicon oxide.

9. The process of claim 7 wherein said depositing comprises depositing silicon oxide doped with phosphorus.

10. The process of claim 7 wherein cleaning the reactor in situ comprises introducing a fluorine-containing compound into the reactor.

11. The process of claim 10 wherein the fluorine-containing compound comprises $NF_3$.

12. The process of claim 7 comprising forming a capacitively-coupled plasma in the reactor.

13. The process of claim 12 wherein said forming precedes said creating.

14. The process of claim 7 wherein said creating comprises applying a fluctuating voltage to a coil.

* * * * *